(12) United States Patent
Salters

(10) Patent No.: US 6,757,205 B2
(45) Date of Patent: Jun. 29, 2004

(54) DEVICE WITH INTEGRATED SRAM MEMORY AND METHOD OF TESTING SUCH A DEVICE

(75) Inventor: Roelof Herman Willem Salters, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 211 days.

(21) Appl. No.: 09/851,442

(22) Filed: May 8, 2001

(65) Prior Publication Data

US 2001/0053102 A1 Dec. 20, 2001

(30) Foreign Application Priority Data

May 9, 2000 (EP) .......................................... 00201654

(51) Int. Cl.[7] ................................................ G11G 7/00
(52) U.S. Cl. ...................................... 365/201; 365/226
(58) Field of Search ........................... 365/201, 230.06, 365/223, 104, 226, 154, 189.01

(56) References Cited

U.S. PATENT DOCUMENTS

| | | | |
|---|---|---|---|
| 4,680,762 A | 7/1987 | Hardee et al. ............... 371/28 |
| 5,353,256 A | * 10/1994 | Fandrich et al. ....... 365/185.11 |
| 5,559,745 A | 9/1996 | Banik et al. ................. 365/201 |
| 5,629,943 A | 5/1997 | McClure .................... 371/21.1 |
| 5,835,429 A | 11/1998 | Schwarz ..................... 365/201 |
| 5,930,185 A | 7/1999 | Wendell ..................... 365/201 |
| 6,192,001 B1 | * 2/2001 | Weiss et al. ................. 365/190 |
| 6,212,115 B1 | * 4/2001 | Jordan ........................ 365/201 |
| 6,252,820 B1 | * 6/2001 | Nakamura ............. 365/189.03 |

FOREIGN PATENT DOCUMENTS

| | | |
|---|---|---|
| EP | 0590982 A2 | 4/1994 |
| EP | 0731471 A1 | 9/1996 |

* cited by examiner

*Primary Examiner*—David Nelms
*Assistant Examiner*—Thong Le
(74) *Attorney, Agent, or Firm*—Aaron Waxler

(57) ABSTRACT

An integrated circuit contains a static memory cell with a pair of cross-coupled inverters. The outputs of the inverters are coupled to bitlines the main current channels of access transistors. The integrated circuit operates in a normal mode and in a test mode. In the test mode the conductivity of the access transistors is made relatively higher in proportion to the drive strength of the memory cell while substantially equal voltages are applied to the bitlines (for example by applying a voltage to the wordline that makes the access transistors more conductive than during access in the normal mode). An error is detected when this causes the state of the cell to flip.

9 Claims, 3 Drawing Sheets

DEVICE WITH INTEGRATED SRAM MEMORY AND METHOD OF TESTING SUCH A DEVICE

FIELD OF THE INVENTION

Testing is an indispensable step in integrated memory manufhewre. Standard tests involve writing data to a memory cell and subsequently reading the memory cell to detect whether the memory cell has retained the data. Normal writing and reading allows the detection of a number of circuit errors in the memory cell, but not all. Additional measures are needed to detect other errors.

BACKGROUND OF THE INVENTION

U.S. Pat. No. 5,835,429 describes a method of testing for weak SRAM memory cells that are unable to retain data permanently, U.S. Pat. No. 5,559,745 discloses a similar test technique. The cells are tested by writing data with lowered word line voltage. The word line voltage controls the conductivity of access transistors that connect the memory cell to the bit lines. By lowering the word line voltage the access transistors are made less conductive during writing. As a result data is written only weakly into the cell. This is sufficient to write into weak memory cells, but insufficient to write into normal, "strong" memory cells. Hence, weak cells show up when data is read from the cells after weak writing.

U.S. Pat. No. 5,930,185 also discloses lowering the word line voltage during writing for test purposes, but in this case defective cells are distinguished from normal cells because the defective cells do not retain the weakly written data.

Newly developed integrated circuit manufacturing processes continuously reduce the dimensions of transistors used in SRAM memory cells. As a result, discrepancies between the parameters of different transistors in the memory cell become relatively more important. It has been found that if the discrepancy is too large, the noise margin of the memory cell is reduced to an unacceptably low level. This is hard to test, because it would take a very long time to determine how all cells in a very large memory respond to noise.

SUMMARY OF THE INVENTION

Amongst others, it is an object of the invention to test the noise margin of static memory cells.

The method of testing SRAM memory cells according to the invention is set forth in claim 1. According to the invention, data is written into an SRAM memory cell and read back. In between, the ratio between the conductivity of the access transistors and the drive strength of the inverters in the static memory cells is made higher than during the normal mode, for example by applying a voltage outside the power supply range to the word line of the memory cell, so as to make the access transistors more conductive than during normal use, while applying substantially equal voltages to the bit lines.

Thus, the access transistors and the bit lines operate to provide a relatively higher load to the memory cell than in the normal mode. This shifts the voltages in the memory cell, mimicking the result of noise. If the cell has sufficient noise margin, it will return to its original state once the voltage on the wordline is returned to normal. If, not, the state of the memory cell will flip, which is detected by reading the content of the cell. To support such a test, an SRAM device according to the invention contains means for applying a voltage to the wordline outside its normal range in the test mode, while applying substantially equal voltages to the bit lines.

BRIEF DESCRIPTION OF THE DRAWING

These and other advantageous aspects of the method and device according to the invention will be described in more detail using the following figures, of which

DETAILED DESCRIPTION OF THE PRIMARY EMBODIMENT

Figure 1:
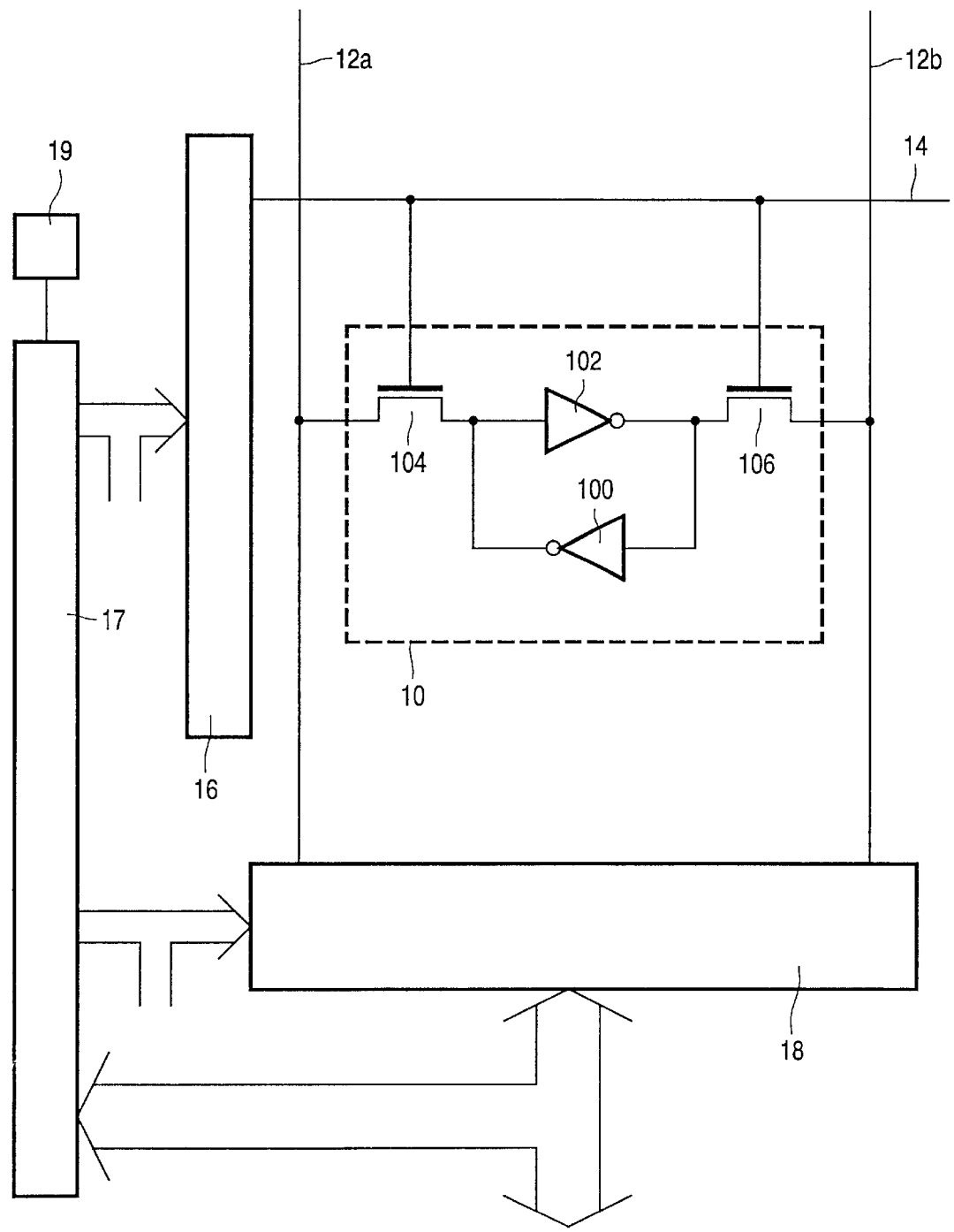
FIG. 1 shows part of a circuit with an SRAM memory FIGS. 2a,b show phase charts of an SRAM cell FIGS. 3a,b show voltages occurring in the SRAM memory during test

FIG. 1 shows part of an SRAM memory. FIG. 1 shows an SPAN memory cell 10, a first and second bit line 12a,b, a word line 14, a row decoder 16, a read/write circuit 18, a test control circuit 17 and a high voltage source 19. Usually, the memory contains a matrix of rows and columns of memory cells like memory cell 10, but for reasons of clarity, only one memory cell 10 is shown. The SRAM memory cell 10 contains a first and second, inverter 100, 102 and a first and second access transistor 104, 106. The output of the first inverter 100 is coupled to the input of the second inverter 102. The output of the second inverter 102 is coupled to the input of the first inverter 100. The channel of the first access transistor 104 is coupled between the output of the first inverter 100 and the first bitline 12a. The channel of the second access transistor 106 is coupled between the output of the second inverter 102 and the second bitline 12b. The gates of the access transistors 104, 106 are coupled to the word line 14. The bitlines 12a,b are coupled to the read write circuit 18. The wordline is coupled to the row decoder 16. The high voltage source 19 is coupled to the row decoder 16 via test control circuit 17. Test controller has outputs coupled to the address inputs of the row decoder 16 and to the address and data inputs of read/write circuit 18.

Usually, there is a number of word lines 14, each coupled to the access transistors of the memory cells in one row of the memory matrix and to a corresponding output of the row decoder 16, but for reasons of clarity only one word line 14 is shown. Similarly, the memory usually contains a number of bit lines pairs 12a,b, each coupled to the channels of the access transistors 104, 106 of a column of memory cells 10 and to the read/write circuit 18, but for reasons of clarity only one pair of bitlines 12a,b is shown.

When data has to be read or written from or to the memory, an address is applied to the memory. In the normal mode, this address is supplied from outside the circuit shown in FIG. 1, for example from a data processing circuit (not shown). Part of the address is supplied to the row decoder 16 and in response, row decoder selects a word line 14 and applies the positive supply voltage VDD to the selected word line 14. The voltage of the other word lines (not shown) is kept at the opposite supply voltage.

Another part of the address is applied to the read/write circuit 18, which selects a pair of bitlines 12a,b in response. On receiving a read enable signal the read/write circuit 18 allows the memory cell 10 to drive the voltage and/or current of the selected bitlines 12a,b through the channel of the access transistors 104, 106 of the memory cell in the selected row. This driving is detected by the read/write circuit 18 and used to determine the state of the memory cell 10. On receiving a write enable signal, the read/write circuit 18 drives one of the bitlines 12*a,b* connected to the memory cell 10 logic low and the read/write circuit 18 drives the other one of the bitlines 12*a,b* logic high. When the access transistors 104, 106 are conductive the voltages on the bitlines 12*a,b* force the memory cell 10 to assume a state determined by which of the bitlines 12*a,b* is high and which is low.

In normal operation the SRAM memory cell 10 is in either one of two states. In a first state the output of the first inverter 100 is logic high and the output of the second inverter 102 is logic low. In a second state the output of the first inverter 100 is logic low and the output of the second inverter 102 is logic high.

Figure 2A:
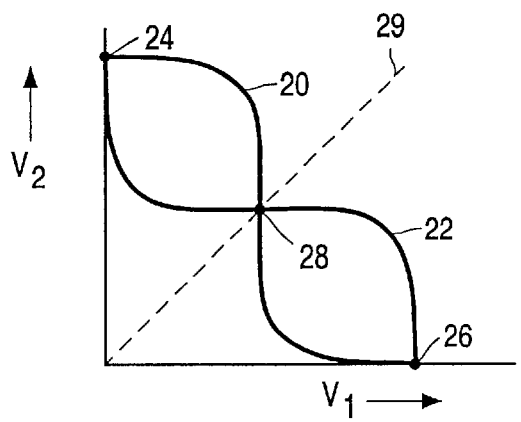

FIG. 2*a* illustrates the operation of the memory cell. This figure shows a first graph 20 of the output voltage V2 of the first inverter 100 (plotted vertically) as a function of the input voltage V1 of the first inverter 100 (plotted horizontally) under stationary conditions. This figure also shows a second graph 22 of the output voltage of the second inverter 102 (plotted horizontally this time on the same scale as the input voltage of the first inverter 100) as a function of the input voltage of the second inverter 102 under stationary conditions (plotted vertically on the same scale as the output voltage of the first inverter 100). The two graphs 20, 22 intersect at three points 24, 26, 28. These points 24, 26, 28 correspond to possible stationary input/output voltages of the inverters 100, 102 together. However one of these points (the point 28 in the middle) is not relevant for memory operation because this point 28 corresponds to a metastable state, i.e. a state from which the input/output voltages will be driven away if there is the least disturbance. The two other points 24, 26 correspond to the stable states of the memory cell 10.

When the combination of input/output voltages V1,V2 is not at one of the stationary points 24, 26, 28, for example due to noise, the inverters 100, 102 will drive back the input/output voltages V1, V2 to one of the stable stationary points 24, 26. Which one of the stationary stable points 24, 26 will be reached depends on the initial value of the input/output voltages V1, V2. If this value is on one side of a borderline 29 a first stationary stable point 24 will be reached. If this value is on the other side of the borderline 29, the second stationary stable point 26 will be reached. The borderline 29 runs through the metastable point 28. Roughly speaking, this point corresponds to the threshold voltages of the first inverters 100 in the horizontal direction and to the threshold voltage of the second inverter 102 in the vertical direction.

FIG. 2*a* shows the position of the borderline 29 that occurs when the inverters 100, 102 are equally matched. In this case the borderline 29 is at the same distance from both stationary stable states 24, 26 for corresponding deviations from these states. This means that the same amount of noise (deviation from the stable points 24, 26) is needed before the memory cell 10 flips from one state 24, 26 to the other 24, 26. This corresponds to the most desirable noise margin. When the inverters 100, 102 are not equally matched, the borderline 29 is closer to one state 24, 26 than to the other. This means that less disturbance is needed to flip the memory cell 10 from the state that corresponds to the point 24, 26 closest to the borderline 29. For reliable operation of the memory cell the parameters of the inverters 100, 102 may not differ too much. Otherwise the risk is too high that the unavoidable noise in the circuit flips the state of the memory cell 10

According to the invention, the reliability of the memory cell 10 is tested by making the access transistors 104, 106 more conductive than during usual access, while driving the bit lines 12*a, b* to substantially equal voltages. The access transistors 104, 106 are made more conductive than during normal write or read by applying a higher voltage to the wordline 14 than during normal write or read. Thus, the ratio between the conductivity of the access transistors 104, 106 and the drive strength of the inverters 100, 102 is increased. (Alternatively, this may be realized by lowering the supply voltage of the memory cell 10, or by a combination of both).

Figure 2B:
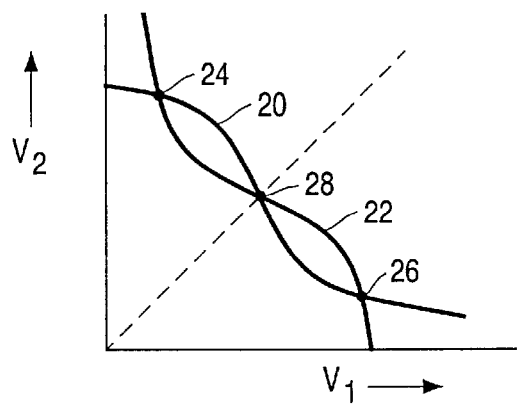

FIG. 2*b* illustrates the effect of making the access transistors 104, 106 more conductive relative to the drive strength of the inverters 104, 106 while both bitlines 12*a,b* are driven to the positive power supply voltage. Effectively the access transistors 104, 106 now form an increased additional NMOS load for the inverters 100, 102. This additional load shifts the graphs 20, 22 (of the input/output relation under stationary conditions) to higher output voltages, thereby shifting the stable points 24, 26 closer to the borderline 29 taken from FIG. 2*a*. The greater the increase in the ratio between the conductivity of the access transistors 104, 106 on one hand and the drive strength of the inverters 100, 102 on the other hand, the more the stable points will be shifted. If due to asymmetry between the inverters 100, 102 the borderline 29 is too close to one of the original stable points 24, 26 of FIG. 2*a,* the stable points of FIG. 2*b* will even be shifted across that borderline 29. As a result, the memory cell 10 will not return to its original state once the access transistors 104, 106 are closed. This can be detected as a change of state by reading the memory cell 10.

Figure 3A:
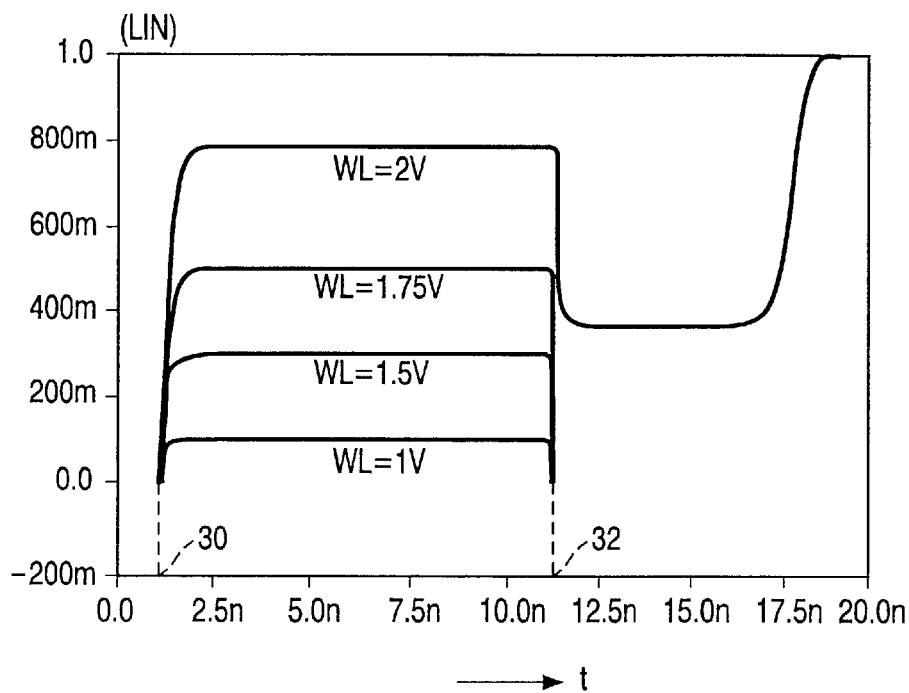

FIG. 3*a* shows a simulation of this effect for a memory cell 10 with equal inverters 100, 102 operating at a supply voltage of VDD=1 Volt. The figure shows the output voltage of one of the inverters 100, 102 as a function of time. Before a first point in time 30, the cell is not accessed and the output voltage is at an initial value corresponding to the data stored in the memory cell 10. Between the first point in time and a second point in time 32, a voltage of VDD is applied to both bitlines 12*a,b* and the access transistors 104, 106 are made conductive. A number of graphs is shown, showing the output voltage for a different word line voltages: 1V, 1.5V, 1.75V and 2 V. It is seen that the output voltage of the inverter 100, 102 rises during the period when an increased word line voltage is applied. After the second point in time 32, the access transistors 104, 106 are made non-conductive. As a result the output voltage returns to its original value, if the word line voltage has not been too high.

Figure 3B:
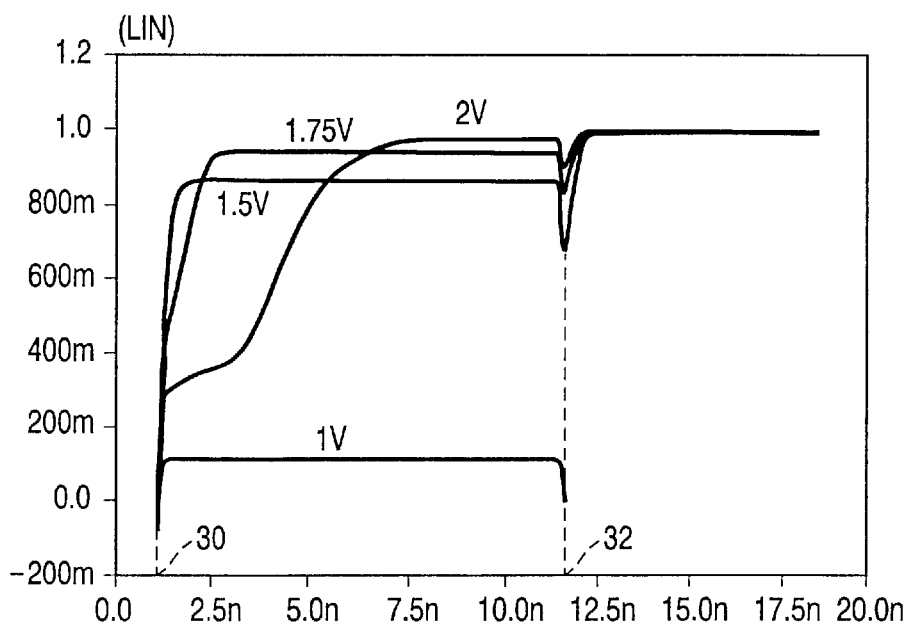

FIG. 3*b* shows output voltage of a memory cell 10 with unequal pull-down transistors (not shown) in the inverters 100, 102, the transistors having a width of 0.6 micron and 0.7 micron respectively. As can be seen, if a sufficiently high wordline voltage has been applied, the output voltage does not return to its original value, revealing unequality of the inverters 100, 102 and therefore problems with the noise margin. Hence, with a wordline voltage higher than 1 Volt and lower than 2 Volt the unequality problem can be detected in this case. The precise minimum and maximum required values for the wordline during this test depend on the design of the memory cell 10, on the parameters of the components (transistors and/or resistors etc.) used in the memory cell 10 and the supply voltage. For higher supply voltages a higher wordline voltage needs to be applied to detect errors. Therefore it is preferred to perform the test at the lowest operable supply voltage. Accordingly, the circuit according to the invention shown in FIG. 1 has a normal operating mode and a test mode.

Figure 4:
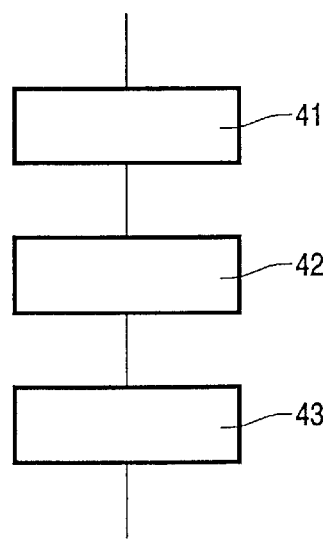
FIG. 4 shows a flow chart of a test method.

FIG. 4 shows the steps taken in the test mode. In a first step 41, a logic one or zero is first normally written into the memory cell. In a second step 42 read/write circuit applies substantially equal bitline voltages to the bitlines 12a,b while the access transistors 104, 106 are conductive (in conventional SRAMs both bitlines are 12a,b are connected in read write circuit 18 to the positive power supply Vdd though equal loads (not shown), which provide for the application of substantially equal bit line voltages). Also in the second step 42, row decoder 16 applies a voltage from high voltage source 19 to the word line 14. This voltage is higher than the voltage applied to the word line in the normal operating mode. At the end of the second step the wordline voltage is reduced to normal values. Afterwards, in a third step 43 the content of the memory cell 10 is normally read, to detect whether the memory cell 10 has flipped.

To detect noise margin problems in both directions, this procedure is performed both after writing a logic one in the memory cell 10 in the first step 41 and after writing a logic zero in the first step 41. When the memory cell 10 is part of a matrix of memory cells, the steps are repeated for successive rows of the matrix, each row being connected to a different word line. If desired, the test may be speeded up by applying an increased word line voltage to several wordlines at the same time, or by applying a lower supply voltage to several or all memory cells at the same time. This will force cells in several or all rows to flip if they have insufficient noise margin. Raising the word line voltages of several word lines at the same time requires a row decoder circuit 16 that is capable of activating several wordlines simultaneously. However, this may not have any use outside the test mode and therefore is may be desirable to apply the high voltage one wordline at a time. Lowering the supply voltage of the memory cells is easier to realize. Detection of flipped cells may be performed at any time after raising the word line voltage, for example before the wordline voltage of any other row is raised, or after the wordline voltages of all rows has been raised. Detection of flipped cells may be performed by reading one column (pair of bitlines 12a,b) at a time and comparing the result with the value that was originally written into the memory cell, but preferably values for all bitlines are read and compared simultaneously to speed up the test. This is possible for example when the read/write circuit 18 has a parallel output for all bitlines 12a,b.

The test can be performed as part of a built in self test, under control of the control circuit 17 in the integrated circuit for controlling execution of the steps, or under control of an external tester (in which case test control circuit may be omitted) Similarly, high voltage source 19 may be a voltage raising circuit in the integrated circuit or simply a bond pad for applying the high voltage, the bond pad being connected to VDD during normal use.

It will be noted that no additional circuits are needed for this test in the matrix of memory cells 10. Hence, the invention makes it possible to test the noise margin, which is considered hard to test, in a normal memory matrix, i.e. without a penalty of increased substrate area for the memory.

What is claimed is:

1. A method of testing an integrated circuit that contains a static memory cell, the integrated circuit comprising a pair of bit lines and a word line, the static memory cell containing a pair of inverters, and a pair of access transistors, each inverter having an input coupled to an output of the other inverter, each bit line being coupled to the output of a respective one of the inverters via a main current channel of a respective one of the access transistors, each access transistor having a control electrode coupled to the word line, the integrated circuit being operable in a normal mode and in a test mode, the method comprising the steps of in the test mode applying substantially equal voltages to the bit lines while applying a control voltage to the word line and a supply voltage to the static memory cell that makes a ratio between a conductivity of the access transistors and a drive strength of the inverters higher than during access in the normal mode;

reading the memory cell;

detecting an error when a state of the cell has flipped due to the applying step.

2. The method according to claim 1 the applying step comprising applying the control voltage to the word line so that the conductivity of the access transistors higher than during access in the normal mode.

3. The method according to claim 1 comprising executing said steps a first and second time, after writing a first and second, mutually opposite logic value into the memory cell respectively.

4. An integrated circuit that is operable in a normal mode and a test mode, the integrated circuit comprising a pair of bit lines and a word line, a static memory cell, the static memory cell containing a pair of inverters, and a pair of access transistors, each inverter having an input coupled to an output of the other inverter, each bit line being coupled to the Output of a respective one of the inverters via a main current channel of a respective one of the access transistors, each access transistor having a control electrode coupled to the word line, a high voltage source coupled to the word line for applying a voltage to the word line in the test mode, the voltage making the access transistors more conductive than during access in the normal mode.

5. The integrated circuit according to claim 4, comprising a test control circuit coupled to the memory cell, and switchable between the normal mode, and arranged for controlling application of said voltage during the test mode while applying substantially equal voltages to the bit lines while applying a voltage, followed by detection whether a state of the memory cell has flipped during application of said voltage.

6. The integrated circuit according to claim 5, the test control circuit being arranged to apply said voltage and detecting said flipping a first and second time, after writing a first and second, mutually opposite logic value into the memory cell respectively.

7. An integrated circuit that is operable in a normal mode and a test mode, the integrated circuit comprising a pair of bit lines and a word line, a static memory cell, the static memory cell containing a pair of inverters, and a pair of access transistors, each inverter having an input coupled to an output of the other inverter, each bit line being coupled to the output of a respective one of the inverters via a main current channel of a respective one of the access transistors, each access transistor having a control electrode coupled to the word line, a low voltage source coupled a supply input of the static memory cell, to the word line for applying a supply voltage to the memory cell in the test mode, the voltage making a drive strength of the inverters smaller than during access in the normal mode.

8. The integrated circuit according to claim 7, comprising a test control circuit coupled to the memory cell, and switchable between the normal mode, and arranged for controlling application of said voltage during the test mode while applying substantially equal voltages to the bit lines while applying a voltage, followed by detection whether a state of the memory cell has flipped during application of said voltage.

9. The integrated circuit according to claim 8, the test control circuit being arranged to apply said voltage and detecting said flipping a first and second time, after writing a first and second, mutually opposite logic value into the memory cell respectively.

* * * * *